(12) United States Patent
Chen et al.

(10) Patent No.: US 7,064,017 B2
(45) Date of Patent: Jun. 20, 2006

(54) METHOD OF FORMING A CMOS TRANSISTOR

(75) Inventors: Kun-Hong Chen, Taipei (TW); Ming-Yan Chen, Jhubei (TW)

(73) Assignee: AU Optronics Corp., Hsinchu (TW)

( * ) Notice: Subject to any disclaimer, the term of this patent is extended or adjusted under 35 U.S.C. 154(b) by 196 days.

(21) Appl. No.: 10/812,961

(22) Filed: Mar. 31, 2004

(65) Prior Publication Data

US 2005/0084995 A1   Apr. 21, 2005

(30) Foreign Application Priority Data

Oct. 15, 2003  (TW) .............................. 92128630 A

(51) Int. Cl.
*H01L 21/84* (2006.01)
*H01L 21/00* (2006.01)

(52) U.S. Cl. ...................... 438/149; 438/153; 438/185; 633/E21

(58) Field of Classification Search ................. 438/149
See application file for complete search history.

(56) References Cited

U.S. PATENT DOCUMENTS

| 6,156,598 | A | * | 12/2000 | Zhou et al. .................. 438/231 |
| 6,699,738 | B1 | * | 3/2004 | Hwang et al. ............... 438/149 |
| 2002/0028543 | A1 | * | 3/2002 | Yamazaki et al. ........... 438/154 |

\* cited by examiner

*Primary Examiner*—Asok Kumar Sarkar
(74) *Attorney, Agent, or Firm*—Rabin & Berdo, PC

(57) ABSTRACT

A method of forming a CMOS transistor on a substrate is provided, wherein the method requires only two implanting procedures to form all source/drain and light doped region. First, the source/drain of an NMOS transistor is formed by using a photoresist layer which covers up the source/drain of a PMOS transistor as a mask with a phosphorus dopant being implanted into. Next, the lightly doped region of an NMOS transistor and the source/drain of a PMOS transistor are formed by using a photoresist layer which covers up the source/drain of an NMOS transistor as well as the gate as masks with a boron dopant being implanted into. Of which, the dosage of the boron dopant is smaller than that of the phosphorus dopant.

20 Claims, 9 Drawing Sheets

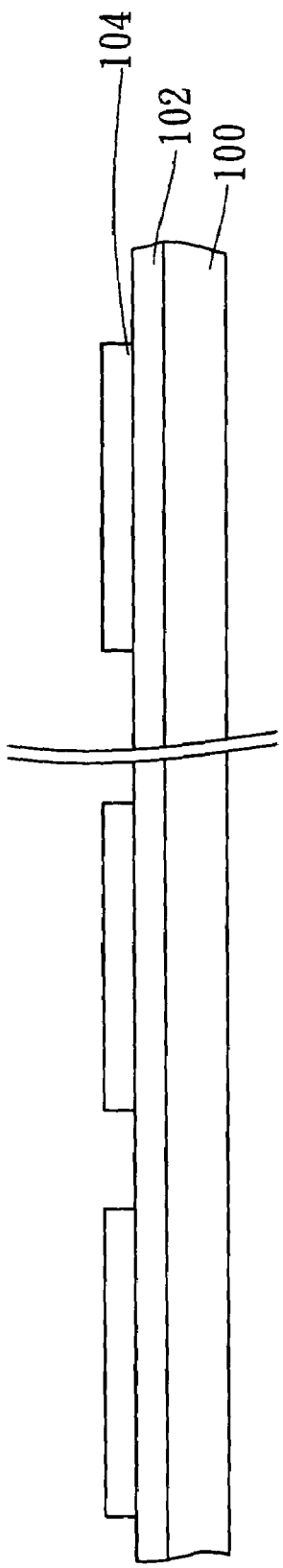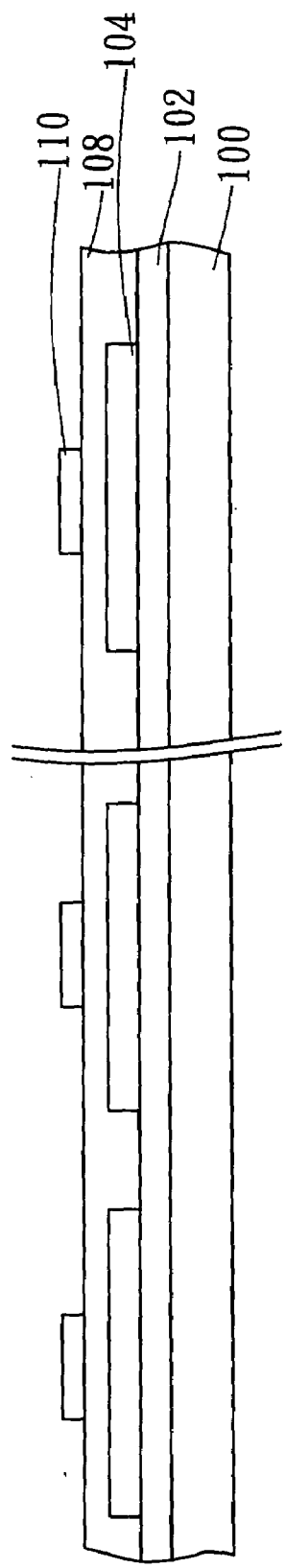
FIG. 1A (PRIOR ART)
FIG. 1B (PRIOR ART)

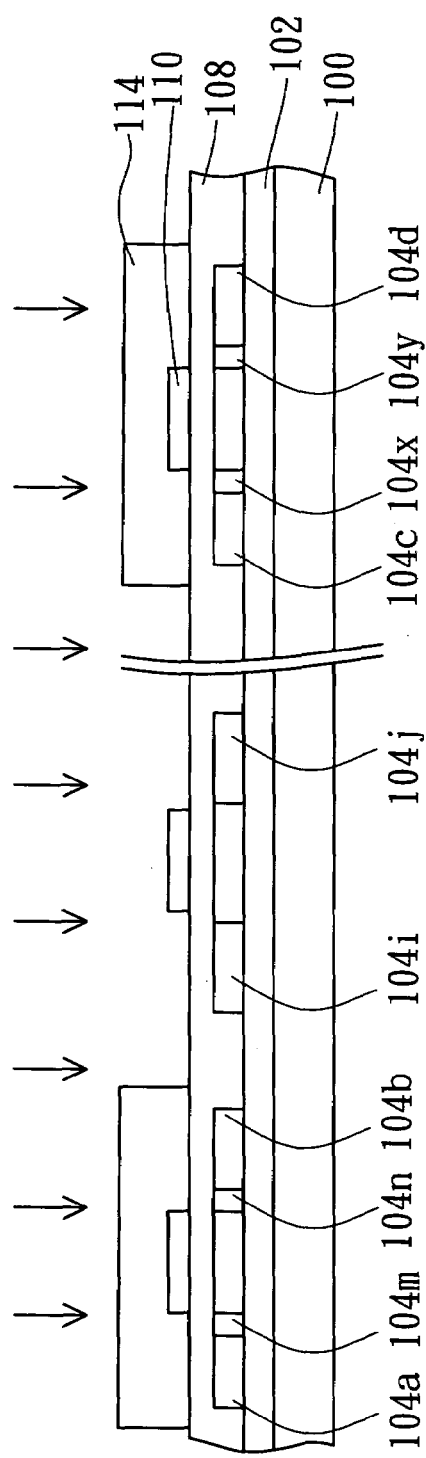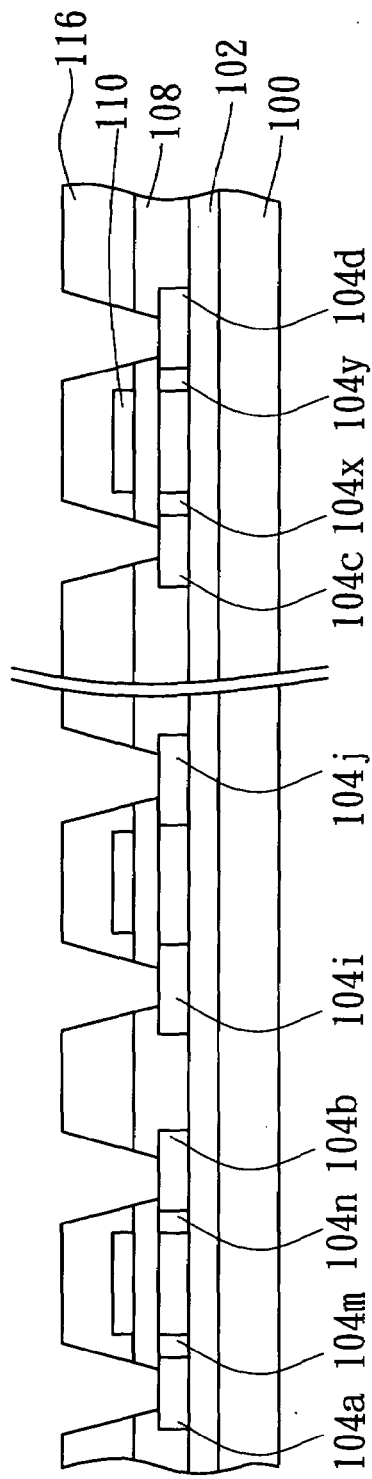
FIG. 1E (PRIOR ART)
FIG. 1F (PRIOR ART)

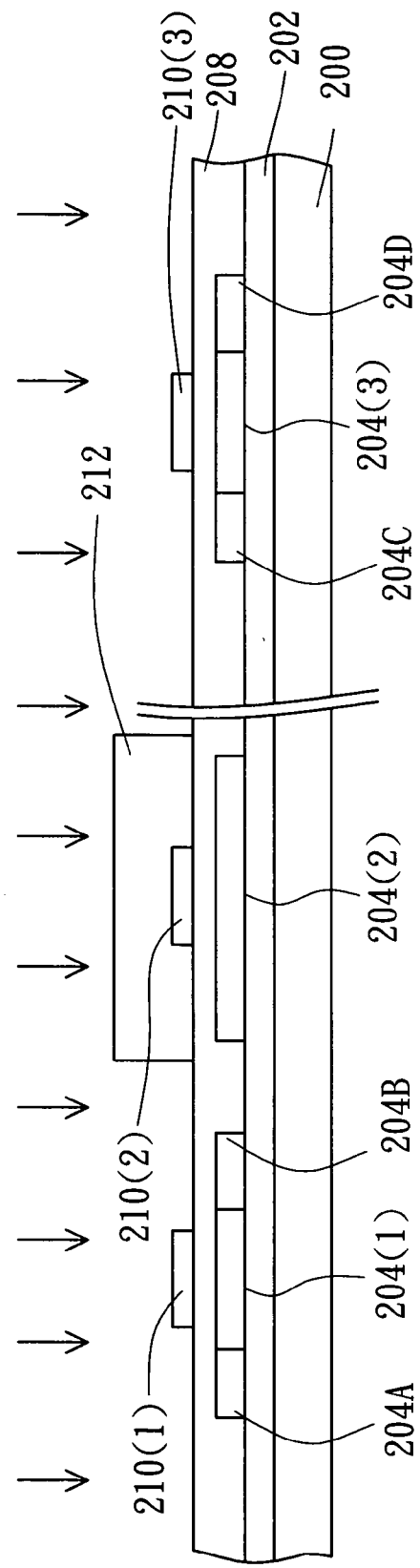
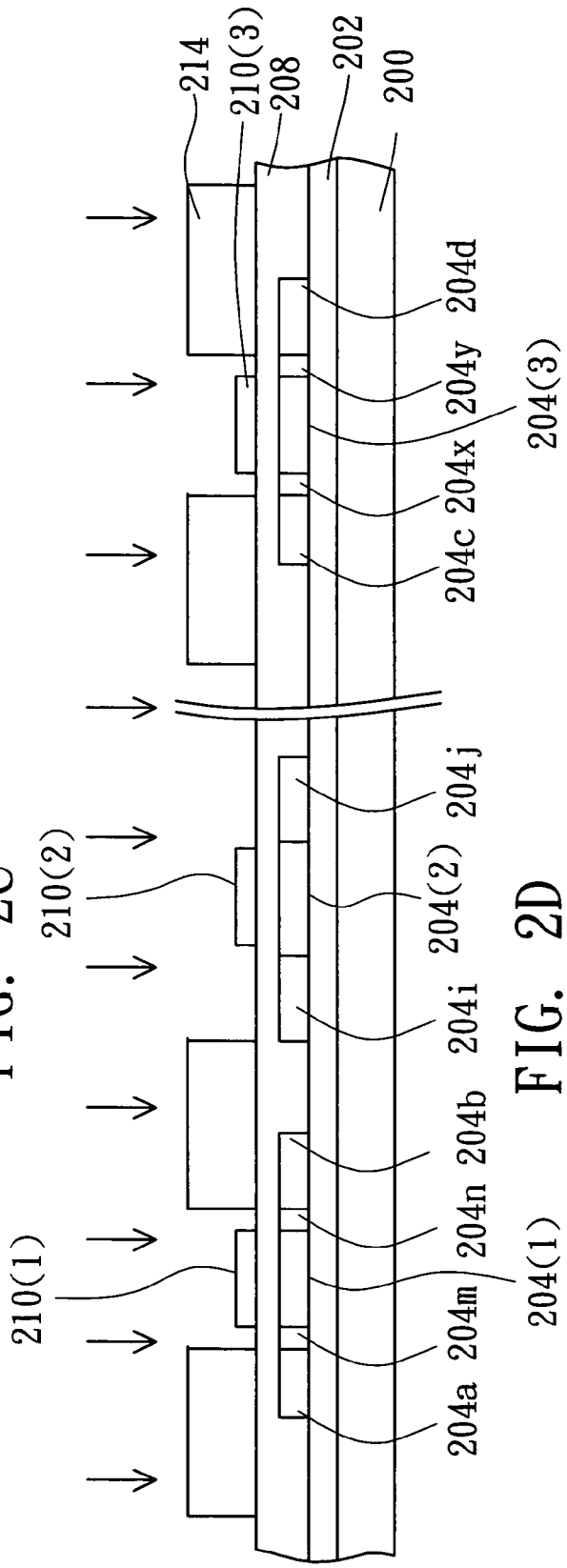

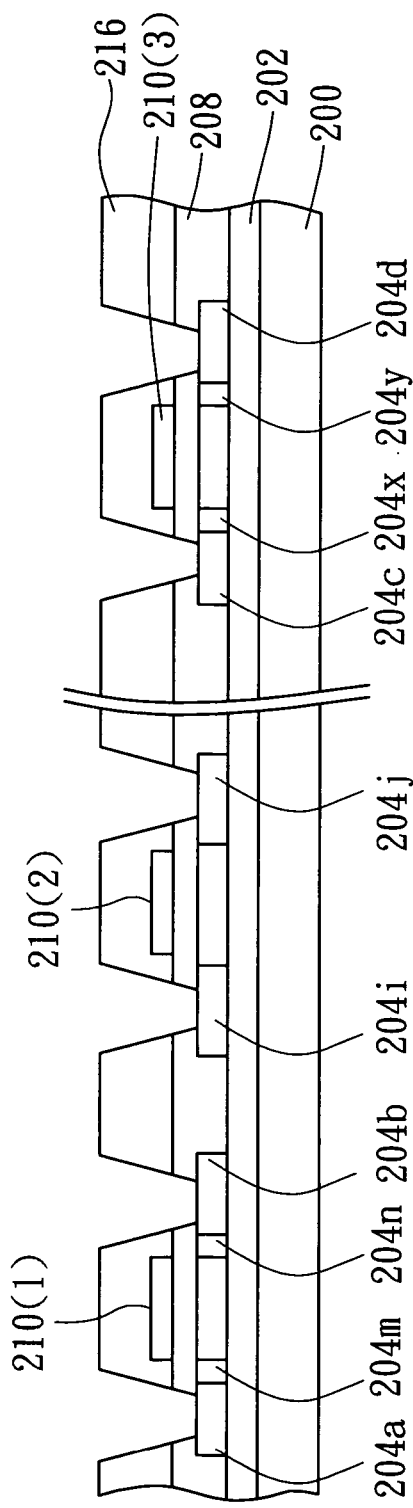
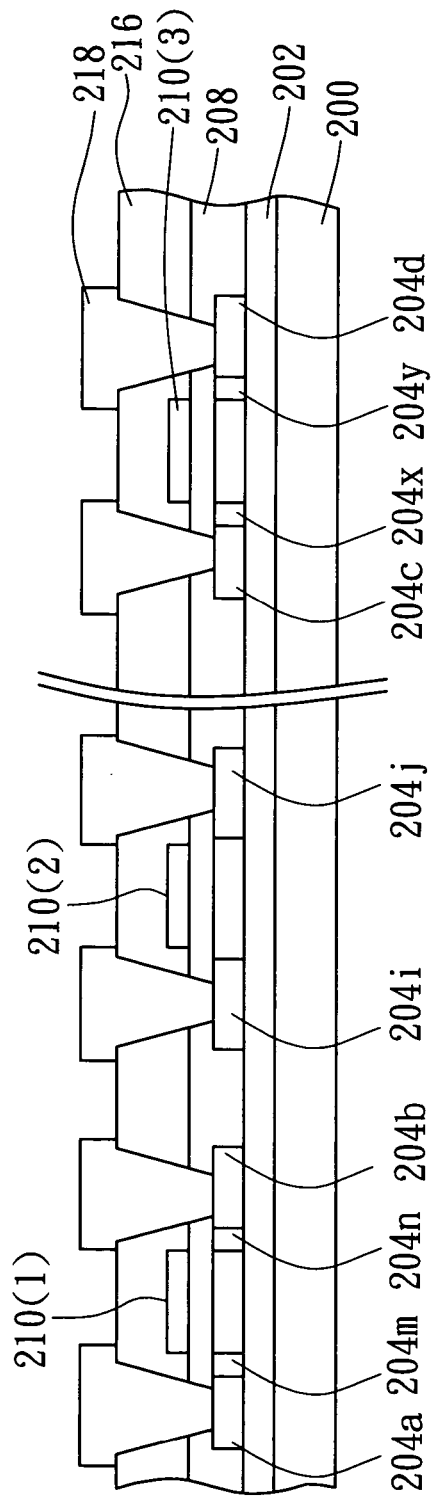
FIG. 2E
FIG. 2F

METHOD OF FORMING A CMOS TRANSISTOR

This application claims the benefit of Taiwan application Serial No. 92128630, filed Oct. 15, 2003.

BACKGROUND OF THE INVENTION

1. Field of the Invention

The invention relates in general to a manufacturing method of forming a CMOS transistor, and more particularly to a manufacturing method of forming the source/drain and lightly doped region of a CMOS transistor using two procedures of implantation.

2. Description of the Related Art

While most thin film transistors used in flat displays are manufactured via amorphous silicon manufacturing process, only a few advanced products adopt polysilicon manufacturing process which has higher electron mobility. Polysilicon technology allows more electronic circuits to be integrated into, so the overall complexity and weight of product can be reduced. Since the highest temperature during polysilicon manufacturing process is over 300° C., a temperature far above the softening point of plastics, so this manufacturing process can only be applied to glass substrate.

Referring to FIG. 1A~1I, diagrams showing a conventional manufacturing process of a low-temperature polysilicon thin film transistor. Firstly, in FIG. 1A, a buffer layer 102 and a polysilicon layer 104 are sequentially formed on a substrate 100, wherein the polysilicon layer is formed by using excimer laser to crystallization anneal the amorphous layer. Next, a patterned photoresist layer is formed (not shown here) and the polysilicon layer 104 as shown in FIG. 1A is formed thereafter by using the photoresist layer as a mask of etching process.

After that, referring to FIG. 1B, a gate oxide 108 is deposited over buffer layer 102 and polysilicon layer 104; a conductive layer is further formed over gate oxide 108. Gate 110 is then formed by using photolithography and etching process. Following that, in FIG. 1C, a photoresist layer 112 which covers up entire PMOS transistor region as well as the gate and lightly doped region of NMOS transistor is formed. Furthermore, photoresist layer 112 is used as mask and a high concentration phosphorus dopant is implanted to form the source/drain 104a, 104b, 104c, and 104d of NMOS transistor.

Following that, in FIG. 1D, the remnants of photoresist layer 112 are removed, gate 110 is used as mask directly, and a low concentration phosphorus dopant is implanted into substrate 100 to form the lightly doped regions 104m, 104n, 104x, and 104y of NMOS transistor. Next, in FIG. 1E, a photoresist layer 114 is formed again, wherein the photoresist layer 114, which covers up entire NMOS transistor region, is used as mask, and a high concentration boron dopant is implanted into substrate 100 to form the source/drain 104i and 104j of P-type transistor.

In FIG. 1F, first of all, the photoresist layer 104 is removed, an inner dielectric layer 116 is formed on gate 110 and gate oxide 108 with a plurality of openings are formed in inner dielectric layer 116 and gate oxide 108. Next, in FIG. 1G, an electrode 118 which can be electrically connected to source/drain 104a, 104b, 104c, 104d, 104i, and 104j is formed therein.

Next, in FIG. 1H, a passivation layer 120 is formed on electrode layer 118 and inner dielectric layer 116, wherein an opening is formed on passivation layer 120 of pixel region so that electrode 118 can be exposed. Lastly, in FIG. 1I, a transparent electrode 122 which can be electrically connected to electrode 118 of pixel region is formed so as to conclude the manufacturing process of low-temperature polysilicon thin film transistor.

The manufacturing process of low-temperature polysilicon thin film transistor according to the conventional technology requires eight photo-masking and three procedures of ion implantation, wherein the eight processes of masking are illustrated in FIG. 1A~1C and FIG. 1E~1I while the three procedures of ion implantation are illustrated in FIG. 1C~1E. However, each manufacturing procedure adds to an increase in manufacturing cost. It is therefore an urgent need to reduce the required number of manufacturing procedures if the manufacturing cost is to be further cut down.

SUMMARY OF THE INVENTION

It is therefore an object of the invention to provide a manufacturing method of forming a CMOS transistor using less manufacturing procedures.

It is therefore an object of the invention to provide a method of forming a Type-I transistor and a Type-II transistor suitable for liquid crystal display (LCD). The method comprises the following procedures: providing a substrate; forming a first polysilicon layer and a second polysilicon layer corresponding to the Type-I transistor and the Type-II transistor respectively on the substrate; blanket depositing a gate insulating layer on the first polysilicon layer, the second polysilicon layer, and the substrate; forming a first gate and a second gate on the gate insulating layer respectively corresponding to the first polysilicon layer and the second polysilicon layer; performing a first doping using a first type dopant to form a first heavily doped region in the first polysilicon layer beside the first gate; and performing a second doping using a second type dopant to simultaneously form a second heavily doped region in the second polysilicon layer beside the second gate and form a lightly doped region in parts of the first heavily doped region beside the first gate, wherein the dosage of the second type dopant is smaller than that of the first type dopant.

Following the step of forming a lightly doped region of the Type-I transistor and a second heavily doped region of the Type-II transistor, the invention further comprises the following procedures: First, forming a 500~700 angstrom thick inner dielectric layer on the gate insulating layer, the first gate and the second gate; second, selectively exposing the first heavily doped region, the second heavily doped region, the first gate and the second gate; third, forming an electrode includes either of Mo, Cr, and Ti/Al/Ti to be electrically connected to the exposed first heavily doped region, second heavily doped region, first gate and second gate.

Following the step of forming the electrode, the invention further comprises the following procedures: First, forming a patterned passivation layer on the inner dielectric layer and the electrode, wherein the patterned passivation layer exposes part of the electrode of the Type-I transistor situated in pixel region. Second, forming a transparent electrode including indium-tin oxide (ITO) to be electrically connected to the exposed part of the electrode of the Type-I transistor.

In the invention, the Type-I transistor is an NMOS transistor while the Type-II transistor is a PMOS transistor, wherein the first type dopant is a phosphorus dopant while the second type dopant is a boron dopant; or alternatively, the Type-I transistor is a PMOS transistor while the Type-II transistor is an NMOS transistor, wherein the first type dopant is a boron dopant while the second type dopant is a phosphorus dopant.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 1A~1I are diagrams showing the manufacturing process of a conventional low-temperature polysilicon thin film transistor; and FIG. 2A~2H are diagrams showing the manufacturing process of a low-temperature polysilicon thin film transistor suitable for liquid crystal display (LCD) according to the invention.

DETAILED DESCRIPTION OF THE INVENTION

The invention provides a manufacturing process of low-temperature polysilicon thin film transistor with fewer steps.

Referring to FIG. 2A~2H, these diagrams show the manufacturing process of a low-temperature polysilicon thin film transistor suitable for liquid crystal display (LCD) according to the invention. First of all, in FIG. 2A, a buffer layer 202 and a polysilicon layer are sequentially formed on a substrate 200. Next, a patterned photoresist layer (not shown here) is formed on the polysilicon layer, and the photoresist layer is used as a shield during etching process to form a polysilicon layer 204(1), 204(2), and 204(3) shown in FIG. 2A.

Substrate 200 according to the invention can be made of glass or plastics. Polysilicon layer 204(1), 204(2), and 204(3) with the thickness of about 200~1000 angstroms are formed by crystallization annealing an amorphous silicon layer on buffer layer 202 by using excimer laser. The polysilicon layers 204(1) and 204(2) at the left are used to form a first NMOS transistor and a first PMOS transistor, which consist of a CMOS transistor, while the polysilicon layer 204(3) at the right is used to form a second NMOS transistor situated in pixel region of the LCD.

Buffer layer 202 can comprise a silicon oxide or a silicon nitride and is used as an isolating layer during the excimer laser annealing process. For example, despite the upper polysilicon layer 204 may reach a temperature as high as 1500° C. during annealing, the regional temperature of a plastic substrate will not exceed 250° C. Furthermore, the regional temperature stays at high levels only for a short while, so the plastic substrate will not be deformed.

Figure 1C:
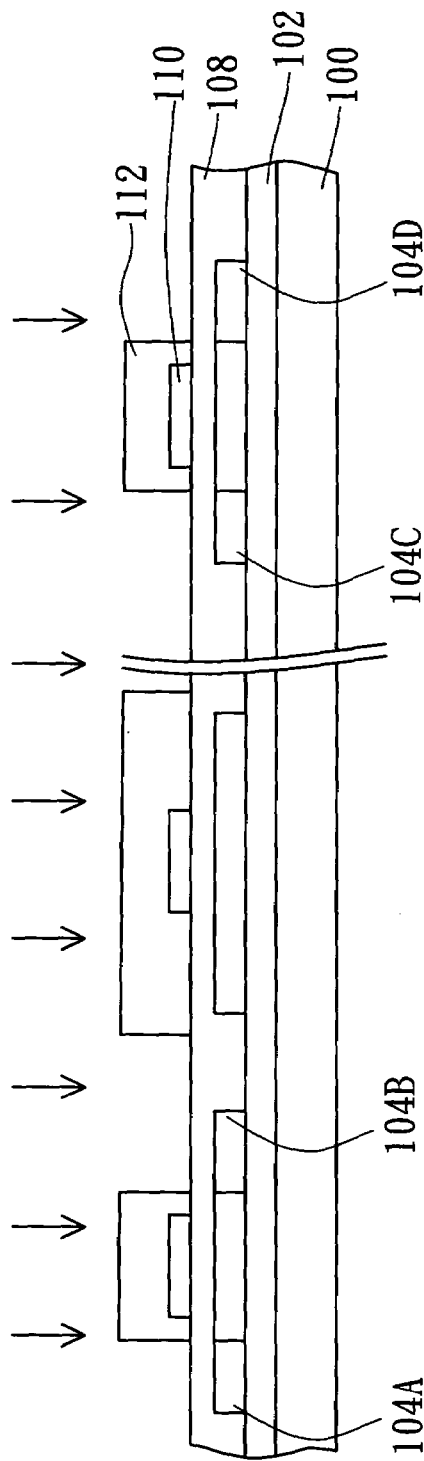
Figure 1D:
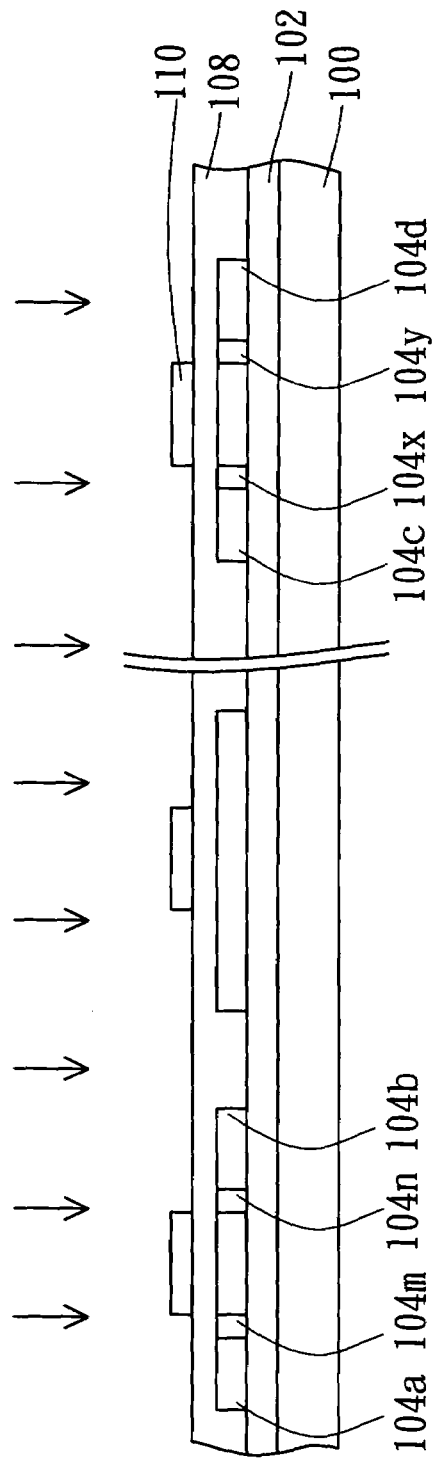
Figure 1G:
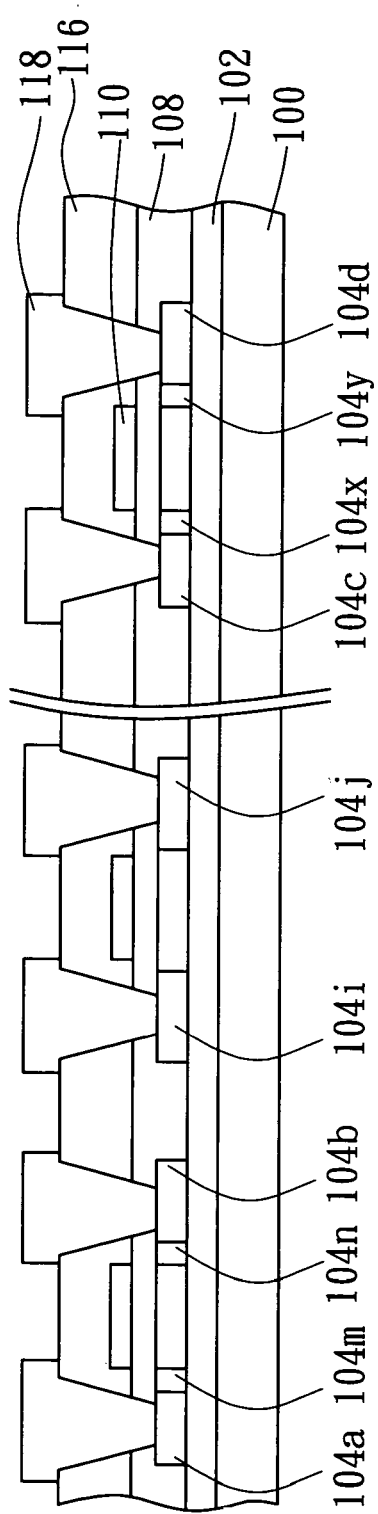
Figure 1H:
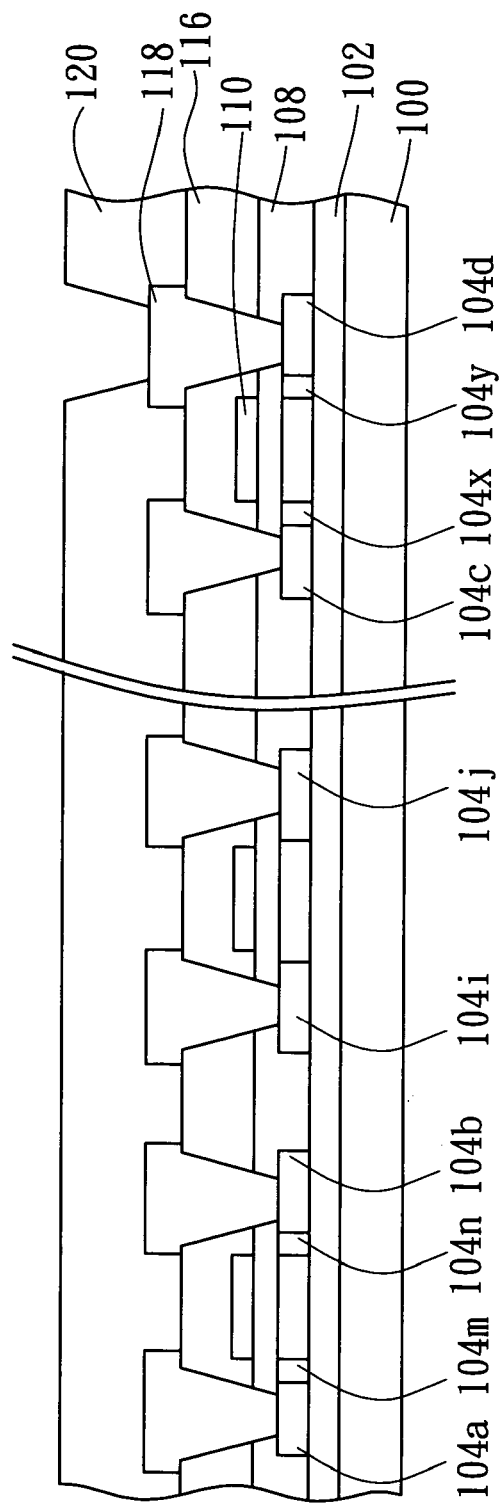
Figure 1I:
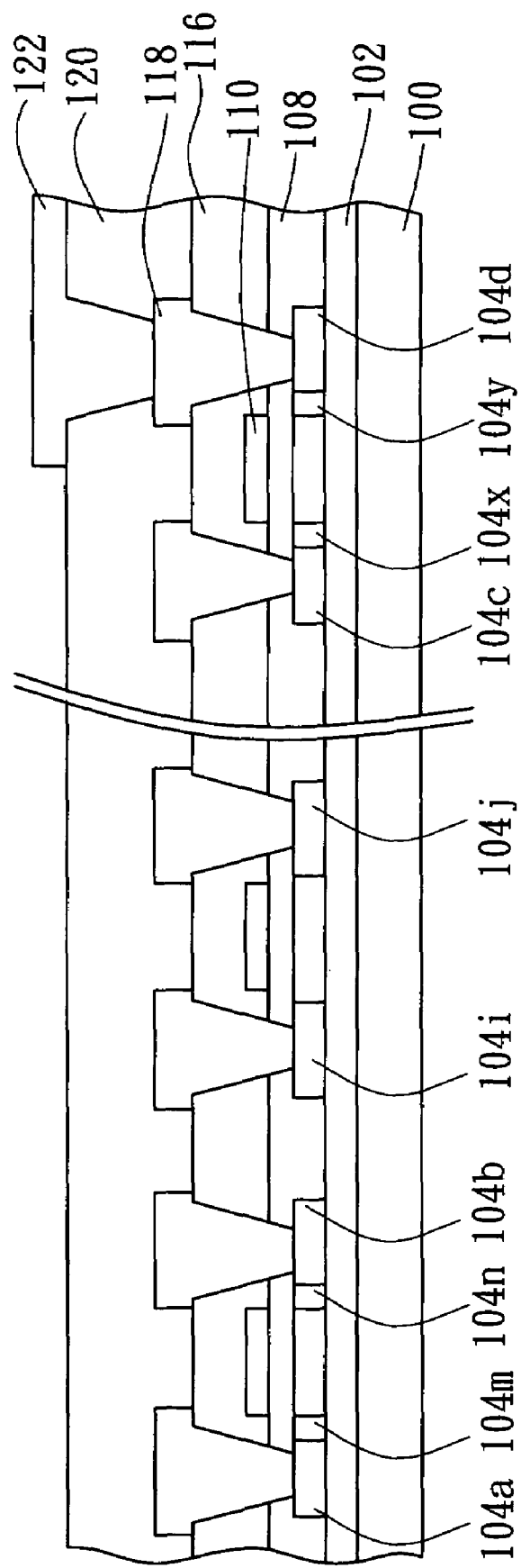
Figure 2A:
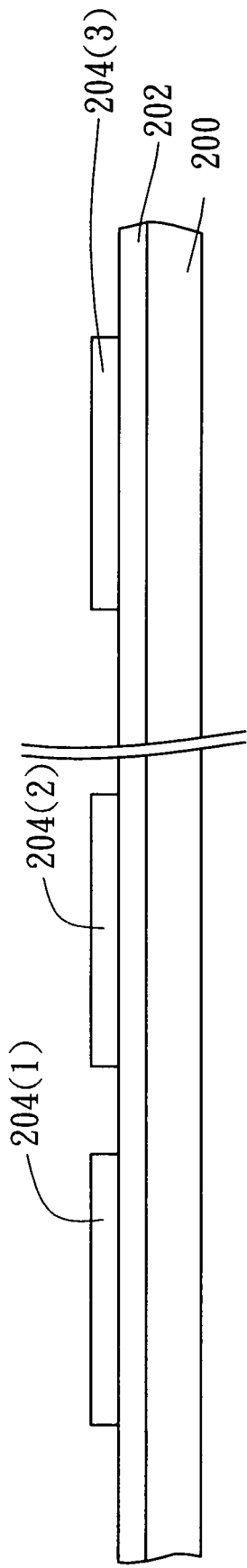
Figure 2B:
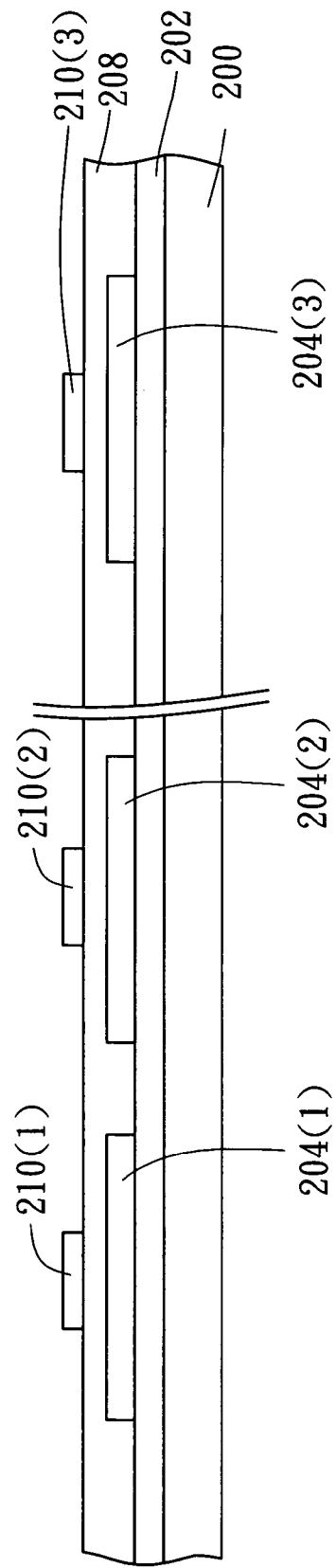

Referring to FIG. 2B, a gate insulating layer, for example, a gate oxide 208, which can comprise $SiO_2$ with a thickness of 500~1500 angstroms, is formed by blanket deposition on the buffer layer 202, the polysilicon layer 204(1), 204(2), and 204(3), and the substrate 200. Next, a conductive layer is deposited on the gate oxide 208, and gate 210(1), 210(2), 210(3), which can include Mo, Cr, or Ti/Al/Ti, are formed using photolithography and etching process. The gate 210(1), 210(2), 210(3) respectively correspond to the polysilicon layer 204(1), 204(2), and 204(3).

After that, in FIG. 2C, a patterned photoresist layer 212 is formed on substrate 200 through photolithography, wherein photoresist layer 212 covers up entire first PMOS transistor region which may form a CMOS transistor. Furthermore, photoresist layer 212 is used as a mask and a high concentration phosphorus dopant is implanted into substrate 200 to form heavily doped regions 204A, 204B, 204C, and 204D on the source/drain and lightly doped region of the first and second NMOS transistors, wherein the dosage of the phosphorus dopant is about 3e13 dosage/$cm^2$~5e15 dosage/$cm^2$. Meanwhile, the part of the source/drain region of the first and second NMOS transistors formed by heavily doped regions 204A, 204B, 204C, and 204D is exactly the source/drain of the first and second NMOS transistors. The heavily doped region 204A and 204B in the polysilicon layer 204(1) are formed beside the first gate 210(1), while the heavily doped region 204C and 204D in the polysilicon layer 204(3) are formed beside the first gate 210(3). This will be further elaborated after the procedures in FIG. 2D are completed.

After that, in FIG. 2D, the remnants of photoresist layer 212 are removed and a patterned photoresist layer 214 is formed on gate oxide 208 through photolithography, wherein photoresist layer 214 covers up the source/drain region of the first NMOS transistor of the CMOS transistor as well as the source/drain region of the second NMOS transistor in pixel region, but not the first PMOS transistor region of the CMOS transistor. Furthermore, photoresist layer 214 is used as a mask and a high concentration boron dopant is implanted into substrate 200 to form heavily doped region 204i and 204j, the source/drain of the first PMOS transistor, as well as lightly doped regions 204m, 204n, 204x and 204y respectively in parts of the heavily doped region 204A, 204B, 204C, and 204D of the first and second NMOS transistors, wherein the dosage of boron dopant is about 3e13 dosage/$cm^2$~5e15 dosage/$cm^2$. The heavily doped regions 204i and 204j in the polysilicon layer 204(2) are formed beside the gate 210(2), the lightly doped regions 204m and 204n are formed beside the gate 210(1), and the lightly doped regions 204x and 204y are formed beside the gate 210(3). In heavily doped regions 204A, 204B, 204C, and 204D, the part other than lightly doped regions 204m, 204n, 204x, and 204y is exactly source/drain 204a, 204b, 204c and 204d of the NMOS transistor.

It is noteworthy that the dosage of the boron dopant must be smaller than that of the phosphorus dopant implanted in order to produce lightly doped regions 204m, 204n, 204x and 204y of the NMOS transistor after the two procedures of boron dopant implantation and phosphorus dopant implantation. However, the invention is not limited to the NMOS transistor with lightly doped regions. A PMOS transistor with lightly doped regions can be another embodiment of the invention. When this is the case, boron dopant is implanted if photoresist layer 212 is used as a mask while phosphorus dopant is implanted if photoresist layer 214 is used as a mask, wherein the dosage of the boron dopant implanted must be greater than that of the phosphorus dopant implanted.

Next, in FIG. 2E, an inner dielectric layer 216 is formed on the entire substrate 200 after photoresist layer 214 is removed, and further a number of openings are formed in inner dielectric layer 216 and gate oxide 208 using photolithography and etching process, wherein inner dielectric layer 216 can include $SiO_2$ with a thickness of 500~7000 angstroms. After that, in FIG. 2F, a conductive layer is formed over the inner dielectric layer 216. The conductive layer fills up the openings in inner dielectric layer 216 and gate oxide 208; and further photolithography and etching process are performed to form electrode 218 which can be electrically connected to gate 210(1)~(3) and part of source/drain 204a, 204b, 204c, 204d, 204i and 204j. This embodiment illustrates the electrical connection between electrode 218 and source/drain 204a, 204b, 204c, 204d, 204i and 204j.

Figure 2G:
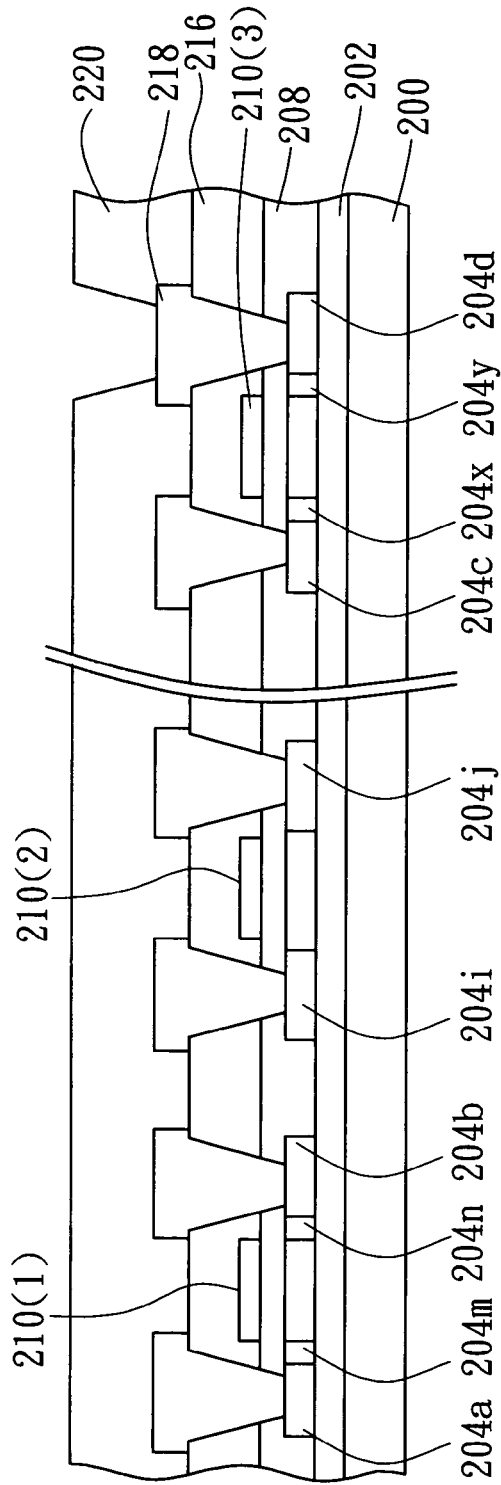
Figure 2H:
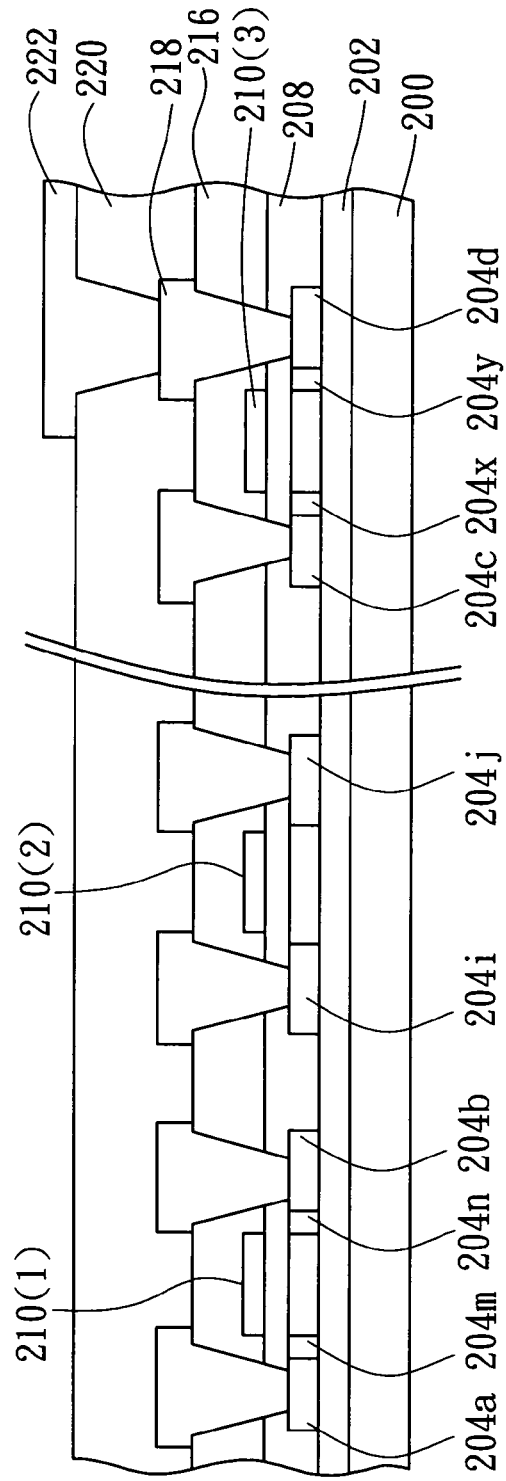

Following that, in FIG. 2G, a passivation layer 220 is formed on electrode 218 and inner dielectric layer 216 and an opening in passivation layer 220 in pixel region is formed through photolithography and etching process. Last, in FIG. 2H, a conductive layer including ITO 220 is formed in passivation layer 220. The conductive layer fills up the opening therein, and further photolithography and etching process are applied to form a transparent electrode 222 which can be electrically connected to electrode 218 in pixel region to complete the manufacturing process of low-temperature polysilicon thin film transistor.

The manufacturing process disclosed in the above preferred embodiment only requires eight processes of masking and two procedures of ion implantation to form low-temperature polysilicon thin film transistor. Of which, the eight masking processes are performed in FIG. 2A~2H, while the two ion implanting procedures are performed in FIG. 2C and FIG. 2D respectively. Generally speaking, the manufacturing method according to the invention requires one less procedure of ion implantation when compared with the conventional technology; hence the manufacturing cost is further cut down.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a Type-I transistor and a Type-II transistor suitable for a liquid crystal display (LCD), comprising:
   providing a substrate;
   forming a first polysilicon layer and a second polysilicon layer corresponding to the Type-I transistor and the Type-II transistor respectively on the substrate;
   blanket depositing a gate insulating layer on the first polysilicon layer, the second polysilicon layer, and the substrate;
   forming a first gate and a second gate on the gate insulating layer respectively corresponding to the first polysilicon layer and the second polysilicon layer;
   performing a first doping using a first type dopant to form a first heavily doped region in the first polysilicon layer beside the first gate; and
   performing a second doping using a second type dopant to simultaneously form a second heavily doped region in the second polysilicon layer beside the second gate and form a lightly doped region in parts of the first heavily doped region beside the first gate, wherein the dosage of the second type dopant is smaller than that of the first type dopant.

2. The method according to claim 1, wherein the method further comprises the step of forming a buffer layer on the substrate prior to the step of forming a first polysilicon layer and a second polysilicon layer.

3. The method according to claim 1, wherein following the step of performing a light doping of the Type-I transistor and a second heavy doping of the Type-II transistor, the method further comprises:
   forming an inner dielectric layer on the gate insulating layer, the first gate and the second gate;
   selectively exposing the first heavily doped region, the second heavily doped region, the first gate and the second gate; and
   forming an electrode to be electrically connected to the first heavily doped region, the second heavily doped region, the first gate and the second gate which have already been exposed;
   wherein the thickness of the inner dielectric layer is about 500~7000 angstroms, and the electrode comprises Mo, Cr or Ti/Al/Ti.

4. The method according to claim 3, wherein following the step of forming the electrode, the method further comprises:
   forming a patterned passivation layer on the inner dielectric layer and the electrode, wherein the patterned passivation layer exposes part of the electrode of the Type-I transistor situated in a pixel region of the LCD; and
   forming a transparent electrode to be electrically connected to the exposed part of the electrode of the Type-I transistor;
   wherein the transparent electrode comprises indium-tin oxide (ITO).

5. The method according to claim 1, wherein the thickness of the first polysilicon layer and the second polysilicon layer is about 200~1000 angstroms, the thickness of the gate insulating layer is about 500~1500 angstroms, and the first gate and the second gate comprise Mo, Cr or Ti/Al/Ti.

6. The method according to claim 1, wherein the Type-I transistor is an NMOS transistor while the Type-II transistor is a PMOS transistor, the first type dopant is a phosphorus dopant, and the second type dopant is a boron dopant.

7. The method according to claim 1, wherein the Type-I transistor is a PMOS transistor while the Type-II transistor is an NMOS transistor, the first type dopant is a boron dopant, and the second type dopant is a phosphorus dopant.

8. The method according to claim 1, wherein the first heavily doped region is source and drain of the Type-I transistor, and the second heavily doped region is source and drain of the Type-II transistor.

9. The method according to claim 1, wherein the dosage of first type dopant is about 3e13 dosage/$cm^2$~5e15 dosage/$cm^2$.

10. The method according to claim 1, wherein the dosage of second type dopant is about 3e13 dosage/$cm^2$~5e15 dosage/$cm^2$.

11. A method of forming a Type-I transistor and a Type-II transistor suitable for a LCD, comprising:
    providing a substrate;
    forming a first polysilicon layer and a second polysilicon layer corresponding to the Type-I transistor and the Type-II transistor respectively on the substrate;
    blanket depositing a gate insulating layer on the first polysilicon layer, the second polysilicon layer, and the substrate;
    forming a first gate and a second gate on the gate insulating layer respectively corresponding to the first polysilicon layer and the second polysilicon layer;
    forming a first patterned photoresist layer covering up entire region of the Type-II transistor;
    performing a first doping using a first type dopant to form a first heavily doped region in the first polysilicon layer beside the first gate using the first photoresist layer as a mask; and
    forming a second patterned photoresist layer covering up the source/drain region of the Type-I transistor;
    performing a second doping using a second type dopant to simultaneously form a second heavily doped region in the second polysilicon layer beside the second gate and form a lightly doped region in parts of the first heavily doped region beside the first gate by using the second photoresist layer as a mask, wherein the dosage of the second type dopant is smaller than that of the first type dopant.

12. The method according to claim 11, wherein the method further comprises the step of forming a buffer layer on the substrate prior to the step of forming a first polysilicon layer and a second polysilicon layer.

13. The method according to claim 11, wherein following the step of performing a light doping of the Type-I transistor and a second heavy doping of the Type-II transistor, the method further comprises:
   forming an inner dielectric layer on the gate insulating layer, the first gate and the second gate;
   selectively exposing the first heavily doped region, the second heavily doped region, the first gate and the second gate; and
   forming an electrode to be electrically connected to the first heavily doped region, the second heavily doped region, the first gate and the second gate which have already been exposed;
   wherein the thickness of the inner dielectric layer is about 500~7000 angstroms, and the electrode comprises Mo, Cr or Ti/Al/Ti.

14. The method according to claim 13, wherein following the step of forming the electrode, the method further comprises:
   forming a patterned passivation layer on the inner dielectric layer and the electrode, wherein the patterned passivation layer exposes part of the electrode of the Type-I transistor situated in a pixel region of the LCD; and
   forming a transparent electrode to be electrically connected to the exposed part of the electrode of the Type-I transistor;
   wherein the transparent electrode comprises indium-tin oxide (ITO).

15. The method according to claim 11, wherein the thickness of the first polysilicon layer and the second polysilicon layer is about 200~1000 angstroms, the thickness of the gate insulating layer is about 500~1500 angstroms, and the first gate and the second gate comprise Mo, Cr or Ti/Al/Ti.

16. The method according to claim 11, wherein the Type-I transistor is an NMOS transistor while the Type-II transistor is a PMOS transistor, the first type dopant is a phosphorus dopant, and the second type dopant is a boron dopant.

17. The method according to claim 11, wherein the Type-I transistor is a PMOS transistor while the Type-II transistor is an NMOS transistor, the first type dopant is a boron dopant, and the second type dopant is a phosphorus dopant.

18. The method according to claim 11, wherein the first heavily doped region is source and drain of the Type-I transistor, and the second heavily doped region is source and drain of the Type-II transistor.

19. The method according to claim 11, wherein the dosage of first type dopant is about 3e13 dosage/cm$^2$~5e15 dosage/cm$^2$.

20. The method according to claim 11, wherein the dosage of second type dopant is about 3e13 dosage/cm$^2$~5e15 dosage/cm$^2$.

* * * * *